(12) United States Patent
Roudbari et al.

(10) Patent No.: US 8,704,232 B2
(45) Date of Patent: Apr. 22, 2014

(54) THIN FILM TRANSISTOR WITH INCREASED DOPING REGIONS

(71) Applicant: Apple Inc., Cupertino, CA (US)

(72) Inventors: Abbas Jamshidi Roudbari, Cupertino, CA (US); Cheng-Ho Yu, Cupertino, CA (US); Shih Chang Chang, Cupertino, CA (US); Ting-Kuo Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/629,531

(22) Filed: Sep. 27, 2012

(65) Prior Publication Data

US 2013/0328053 A1 Dec. 12, 2013

Related U.S. Application Data

(60) Provisional application No. 61/658,869, filed on Jun. 12, 2012.

(51) Int. Cl.
*H01L 29/10* (2006.01)

(52) U.S. Cl.
USPC ..................................... 257/59; 257/E23.163

(58) Field of Classification Search
CPC ................ H01L 27/1214; H01L 27/12; G02F 1/136227
USPC ............................................ 257/59, E23.163
See application file for complete search history.

(56) References Cited

U.S. PATENT DOCUMENTS

| | | | |
|---|---|---|---|
| 4,958,205 A | 9/1990 | Takeda et al. | |
| 5,075,237 A | 12/1991 | Wu | |
| 5,642,129 A * | 6/1997 | Zavracky et al. | 345/100 |
| 5,668,613 A | 9/1997 | Kim et al. | |
| 5,698,902 A * | 12/1997 | Uehara et al. | 257/773 |
| 5,721,155 A | 2/1998 | Lee | |
| 5,990,492 A | 11/1999 | Kim et al. | |
| 5,994,721 A | 11/1999 | Zhong et al. | |
| 6,372,636 B1 | 4/2002 | Chooi et al. | |
| 6,406,928 B1 | 6/2002 | Jen | |
| 6,479,398 B1 | 11/2002 | Chen, Jr. | |
| 6,509,614 B1 | 1/2003 | Shih | |
| 6,525,342 B2 | 2/2003 | Amemiya | |
| 6,686,273 B2 | 2/2004 | Hsu et al. | |
| 6,812,637 B2 | 11/2004 | Cok et al. | |
| 6,967,407 B2 | 11/2005 | Otani et al. | |
| 7,045,406 B2 | 5/2006 | Huotari et al. | |

(Continued)

FOREIGN PATENT DOCUMENTS

| | | |
|---|---|---|
| EP | 0376329 | 7/1990 |
| EP | 2048538 | 4/2009 |

(Continued)

*Primary Examiner* — Nikolay Yushin
(74) *Attorney, Agent, or Firm* — Brownstein Hyatt Farber Schreck, LLP

(57) ABSTRACT

A transistor that may be used in electronic displays to selectively activate one or more pixels. The transistor includes a metal layer, a silicon layer deposited on at least a portion of the metal layer, the silicon layer includes an extension portion that extends a distance past the metal layer, and at least three lightly doped regions positioned in the silicon layer. The at least three lightly doped regions have a lower concentration of doping atoms than other portions of the silicon layer forming the transistor.

9 Claims, 12 Drawing Sheets

(56) References Cited

U.S. PATENT DOCUMENTS

| | | |
|---|---|---|
| 7,199,518 B2 | 4/2007 | Couillard |
| 7,209,057 B2 | 4/2007 | Hashido et al. |
| 7,402,468 B2 | 7/2008 | Park et al. |
| 7,419,858 B2 | 9/2008 | Schuele et al. |
| 7,510,891 B2 | 3/2009 | Chun et al. |
| 7,550,306 B2 | 6/2009 | Park et al. |
| 7,553,707 B2 | 6/2009 | Horino et al. |
| 7,563,669 B2 | 7/2009 | Chittipeddi et al. |
| 7,609,342 B2 | 10/2009 | Yang et al. |
| 7,671,939 B2 | 3/2010 | Araki et al. |
| 7,759,857 B2 | 7/2010 | Vaufrey et al. |
| 7,843,130 B2 | 11/2010 | Shimizu et al. |
| 7,919,918 B2 | 4/2011 | Kim |
| 7,952,104 B2 | 5/2011 | Leonardi et al. |
| 7,956,825 B2 | 6/2011 | Kane |
| 7,969,087 B2 | 6/2011 | Hwang et al. |
| 7,973,470 B2 | 7/2011 | Cok |
| 8,053,978 B2 | 11/2011 | Hwang et al. |
| 8,064,028 B2 | 11/2011 | Katayama et al. |
| 8,072,080 B2 | 12/2011 | Moriwaki |
| 8,102,338 B2 | 1/2012 | Hwang et al. |
| 8,278,661 B2 | 10/2012 | Song |
| 8,294,147 B2 | 10/2012 | Yamazaki et al. |
| 8,339,531 B2 | 12/2012 | Yamauchi |
| 8,363,197 B2 | 1/2013 | Matsuda et al. |
| 8,377,762 B2 | 2/2013 | Eguchi et al. |
| 8,455,872 B2 | 6/2013 | French |
| 8,508,562 B2 | 8/2013 | Akimoto et al. |
| 8,568,877 B2 | 10/2013 | Ferrari et al. |
| 8,610,860 B2 | 12/2013 | Huang et al. |
| 2003/0076282 A1 | 4/2003 | Ikeda et al. |
| 2007/0268229 A1 | 11/2007 | Kang et al. |
| 2009/0026455 A1* | 1/2009 | Matsuda et al. ............. 257/59 |
| 2009/0102052 A1 | 4/2009 | Ryu |
| 2010/0156771 A1 | 6/2010 | Lee et al. |
| 2010/0330811 A1 | 12/2010 | Nagao |
| 2011/0012125 A1 | 1/2011 | Nicholas |
| 2011/0227850 A1 | 9/2011 | Oh et al. |
| 2012/0087460 A1 | 4/2012 | Moriwaki |
| 2012/0105495 A1 | 5/2012 | Choi |
| 2012/0119211 A1 | 5/2012 | Lin |
| 2012/0205658 A1 | 8/2012 | Yamazaki et al. |
| 2012/0248455 A1 | 10/2012 | Van Gestel |
| 2012/0268396 A1 | 10/2012 | Kim et al. |
| 2012/0299976 A1 | 11/2012 | Chen et al. |
| 2013/0027646 A1 | 1/2013 | Cho et al. |
| 2013/0069061 A1 | 3/2013 | Nakazawa |
| 2013/0161622 A1 | 6/2013 | Lee |
| 2013/0328053 A1 | 12/2013 | Roudbari et al. |
| 2013/0335658 A1 | 12/2013 | Huang et al. |
| 2013/0337596 A1 | 12/2013 | Hung et al. |

FOREIGN PATENT DOCUMENTS

| | | |
|---|---|---|
| JP | 2010056015 | 3/2010 |
| WO | WO 2011/030620 | 3/2011 |
| WO | WO 2011/151970 | 12/2011 |

* cited by examiner

THIN FILM TRANSISTOR WITH INCREASED DOPING REGIONS

CROSS REFERENCE TO RELATED APPLICATIONS

This application claims the benefit of U.S. Provisional Patent Application No. 61/658,869, filed Jun. 12, 2012 and entitled "Thin Film Transistor With Increased Doping Regions," the disclosure of which is hereby incorporated herein in its entirety.

TECHNICAL FIELD

The present invention relates generally to transistors, and more specifically, to structures for thin film transistors.

BACKGROUND

Thin film transistors (TFTs) are generally field-effect transistors that have a substrate supporting one or more layers of a semiconductor active layer, a dielectric layer, and metallic contacts. TFTs may be used in a number of electronic devices, such as in liquid crystal displays (LCD), organic light emitting diode displays such as active matrix organic diode (AMOLED) displays, and so on. In these instances, the TFTs may be incorporated into the panel of the display to essentially activate and deactivate select pixels. For example, with LCD displays, each pixel may include a TFT may be communicatively coupled to a red, a blue, and a green pixel, the TFT may selectively activate each pixel cell depending on the desired output. In this way the TFT may act as a switch for each pixel, and thus control the output of the pixel. There are many other uses for TFTs and the above examples are just a couple of conventional uses for TFTs.

SUMMARY

One example of the present disclosure may take the form of a transistor including a metal layer, a silicon layer deposited on at least a portion of the metal layer, the silicon layer including an extension portion that extends a distance past the metal layer, and at least three lightly doped regions positioned in the silicon layer.

Other examples of the present disclosure may take the form of an electronic display. The electronic display may include at least one pixel and a transistor including a metal layer, a silicon layer deposited on at least a portion of the metal layer, the silicon layer including an extension portion that extends a distance past the metal layer, and at least three doped regions positioned in the silicon layer. The transistor is configured to selectively activate the at least one pixel.

An electronic display including at least one pixel and a transistor communicatively coupled to the at least one pixel and configured to selectively activate the pixel. The transistor includes a metal layer, a silicon layer deposited on at least a portion of the metal layer, the silicon layer including an extension portion that extends a distance past the metal layer, and at least three lightly doped regions positioned in the silicon layer.

SPECIFICATION

Overview

Figure 1:
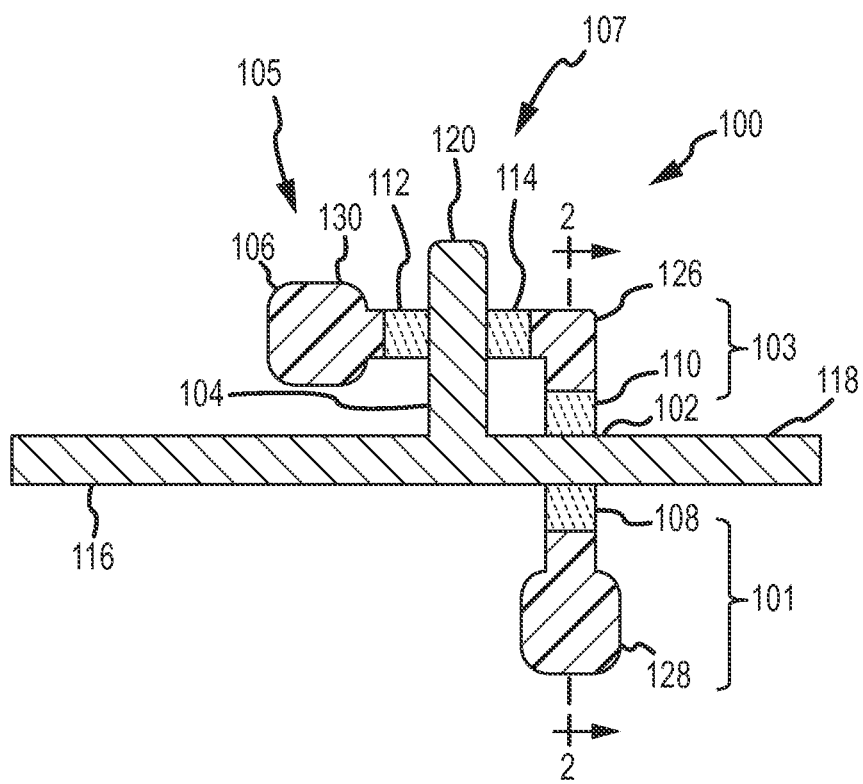
FIG. 1 is a top plan view of conventional TFT with an insulating layer is removed for clarity.

In some embodiments herein, a thin film transistor (TFT) having an extended poly-silicon structure is disclosed. The extension of the poly-silicon structure also includes multiple lightly doped drain (LDD) regions or slots, which introduce one or more doping agents into the poly-silicon structure. The LDD regions may form source/drain pairs acting as junctions for the TFT. As an example, the TFT may include one or more gates defined by creating a channel between two sections of LDD deposited into the poly-silicon structure. The channel may be defined as a portion of the poly-silicon layer that may be in communication with a conductor, such as a metal electrode. The metal electrode may be flanked on either side by two LDD doped regions. When the TFT is activated, a voltage signal is applied to the electrode and electrons act as charge carriers and move between one doped region (a source) to another doped region (drain).

The TFT of the present disclosure may further include an extension member. The extension member may be formed of a poly-silicon layer, or other non-conductive material that may be doped with one or more doping agents to create a semiconductor. In some embodiments, the extension member may include two or more slots of a LDD. The additional LDD regions or slots may act to divide and reduce a lateral electric field, which may in turn reduce current leakage across the junctions of the TFT. Additionally, in some embodiments, the extension may include spacing regions of the non-conductive material that may be positioned between the additional LDD regions to break up the length of the LDD regions. The spacing regions may reduce the series resistance of the LDD regions, and thus increase the conductivity of the TFT, while still acting to reduce the lateral electric field.

The LDD or doped regions of the extension may have the same length or varying lengths. For example, in some instances, the additional LDD region closest to a gate of the TFT may have the largest length and the other LDD regions may have lengths that are smaller than the first LDD region. In this example, the smaller LDD regions may act to divide the lateral electric field, and the largest LDD at the junction may substantially reduce the lateral electric field to zero or near-zero. These embodiments may help to prevent a high electric field at an edge of the channel approaching the gate. Further, because the additional LDD regions may be relatively small, the electric field may be reduced without substantially reducing the conductivity of the TFT. In some embodiments, the LDD regions may gradually increase in length from a first end of the extension towards the gate. However, in other embodiments, the LDDs may be differently dimensioned. For example, each LDD region may have the same length, some of the LDD regions may have the same length, or each LDD region may have a different length.

In some embodiments, the TFT of the present disclosure may be implemented to control one or more pixels or color cells. In these embodiments, the extension of the poly-silicon material including the additional LDD regions may increase the optical performance of a display incorporating the pixels controlled by the TFT. This is because the LDD reduces the lateral electric field to reduce pixel TFT leakage current which may reduce flicker and/or crosstalk in a display, discussed in more detail below.

DETAILED DESCRIPTION

Figure 2:
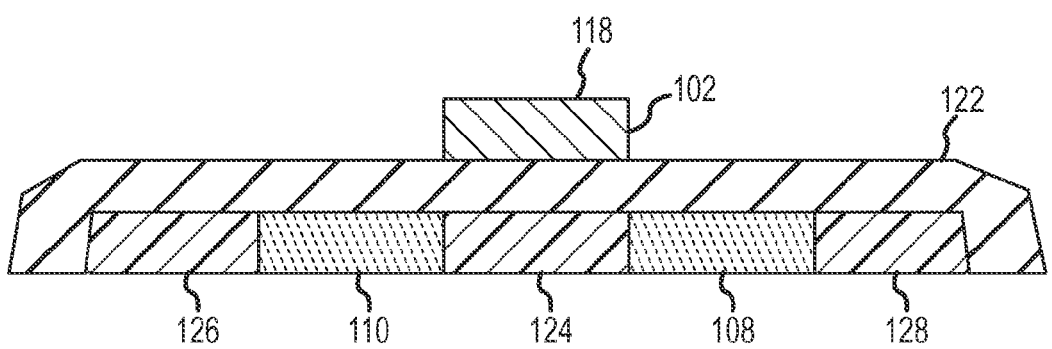
FIG. 2 is a cross-section view of the TFT of FIG. 1 viewed along line 2-2 in FIG. 1 and including the insulating layer.

Turning now to the figures, FIG. 1 is a simplified top plan view of a conventional double gate TFT 100 including two gates 102, 104. In FIG. 1 an insulating layer is removed for clarity. FIG. 2 is a cross-section view of the TFT 100 viewed along line 2-2 in FIG. 1, but including the insulating layer. The TFT 100 includes a conductor, such as a metal layer 116 having a first branch 118 and a second branch 120, which form two gates of the TFT 100. The two metal layer branches 118, 120 are structured to intersect between two doped regions of a silicon layer 106, discussed in more detail below. The metal or conductive layer 116 may be formed of various types of electrical conductors, such as metallic materials (e.g., copper, aluminum, metal alloys), or materials laced with metallic particles.

The silicon layer 106 is often placed on a substrate (not shown), such as mica, silicon nitride, silicon dioxide, metal-coated silicon, quartz, glass or another base material. The silicon layer 106 may be poly-silicon, crystalline silicon, or amorphous silicon, depending on the desired use. In a double gate TFT, such as the TFT 100 illustrated in FIGS. 1 and 2, the silicon layer 106 may have two legs 128, 130 that are interconnected to form a corner portion 126. In this embodiment, the first leg 128 extends across the first metal branch 118 and the second leg 130 extends across the second metal branch 120. The two legs 128, 130 may be doped with one or more dopants (such as, but not limited to, arsenic, boron, antimony, arsenic, aluminum, selenium, germanium, or the like, depending on the particular semiconductor) to define a source and a drain. For example, the first leg 128 may define a first lightly doped region 108 and a second lightly doped region 110. The combination of the poly-silicon of the leg 128 and the lightly doped region 108 may form a source 101, and the combination of the poly-silicon of the leg 126 and the second lightly doped region 110 may form the drain 103, such that the two regions 108, 110 may from portions of the drain and the source for the TFT 100. Accordingly, the source 101 and the drain 103 for the TFT may be formed by a combination of the poly-silicon layer 106 and one or more lightly doped regions 108, 110. Similarly, the second leg 130 may define a source 105 and a drain 106 that may include one or more portions of poly-silicon and lightly doped regions 112, 114. It should be noted that the source and drain for each leg may be interchanged. For example, the silicon leg 126 and doped region 110 may function as a source and the silicon region 128 and lightly doped region 108 may function as a drain.

The doped regions 108, 110, 112, 114 may be doped with the same dopant or different dopants; however, generally, the doped portions may be doped with the same dopant. The doped portions 108, 110, 112, and 114 may be a lightly doped drain (LDD) structure, where the implant density of the dopant may be relatively low, e.g., between $10^{18}$-$10^{23}$ cm$^{-3}$ of impurity atoms. In some embodiments, the silicon layer 106, and specifically the legs and corner portions 126, 128, 130 may be heavily doped regions that include the same dopant or doping type as the lightly doped regions 108, 110, 112, 114. In these embodiments, the lightly doped regions 108, 110, 112, 114 may have a lower density of impurity atoms as compared to the surrounding heavily doped silicon portions 126, 128, 130.

With reference to FIG. 2, the first branch 118 of the metal layer 116 may be positioned above and between a first lightly doped region 108 and a second lightly doped region 110. Similarly, the second branch 120 may be positioned above and between a third lightly doped region 112 and a fourth lightly doped region 114. It should be noted that a gate insulator 122 may physically separate the lightly doped regions 108, 110 from the metal layer 116. A channel 124 may be defined on the silicon layer 106 between the two lightly doped regions 108, 110, and 112, 114, and the channel 124 may be substantially parallel to the branches 118, 120 of the metal layer 116. In this manner, the lightly doped regions 108, 110 and 112, 114 may be separated from each other to define the regions at source 101 and drain 103 and create channel 124 where electrons may flow between when a voltage is applied to the metal layer 116. In some embodiments, the channel 124 may be the only portion of the silicon layer that may not be doped with impurity atoms.

Additionally, as shown in FIG. 2, the silicon layer 106 and the lightly doped regions 108, 110, 112, 114 may be at least partially covered by the gate insulator 122. The insulator 122, which is a dielectric layer, prevents the lightly doped regions 108, 110, 112, and 114 as well as the poly-silicon layer 106 from directly contacting the metal layer 116. The insulator 122 may be substantially any suitable insulator as conventionally known in the art.

With reference to FIG. 2, in operation, a signal or voltage is applied to the metal layer 116 to activate the TFT 100. With a N-type TFT, the activation signal may be positive voltage.

The insulator 122 may act as a dielectric layer in a capacitor and induce a charge in the channel 124 between the two lightly doped regions 108, 110 and 112, 114 and the heavily doped regions 126, 128, 130 (e.g., between the source 101 and drain 103 of each leg of the silicon layer 106). The charge induces an electron flow from the source 101 (defined as the first lightly doped region 108 and the heavily doped silicon portion 128) to the drain 103 (defined as the second lightly doped region 110 and the second heavily doped silicon portion 126), making the channel 124 conductive. The second gate 104 may activate in a similar manner. When the voltage is removed from the metal layer 116 (e.g., gate), the electrons are substantially depleted from the channel 124, so that substantially no current is present in the channel 124.

The TFT 100 of FIGS. 1 and 2 may be used in numerous applications, such as in displays for electronic devices (e.g., LCD) displays. However, in some instances, conventional TFTs, such as the TFT 100 illustrated in FIGS. 1 and 2, may have a relatively large leakage current. In other words, in an "off" state when the turn-off voltage (negative voltage for N-type, positive voltage for p-type) is applied to the metal layer 116, these conventional TFTs may have some current transmitted through the channel 124. In instances where the TFT 100 is used to control one or more pixel elements in a display, current leakage may cause flicker in the display as certain colors of the pixels controlled by one or more TFTs 100 may change brightness due to current leakage, although the TFT 100 may actually be turned off. Similarly, current leakage in the TFT 100 may create crosstalk or another image distortion characteristics as certain pixels may not be turned off completely and there is leakage current in some of the pixels elements controlled by the TFTs 100. For example, thinner transistors devices, such as conventional TFTs, may experience higher electric lateral fields due to two-dimensional effects arising from the reduced junction depth compared to thicker film devices.

Figure 3:
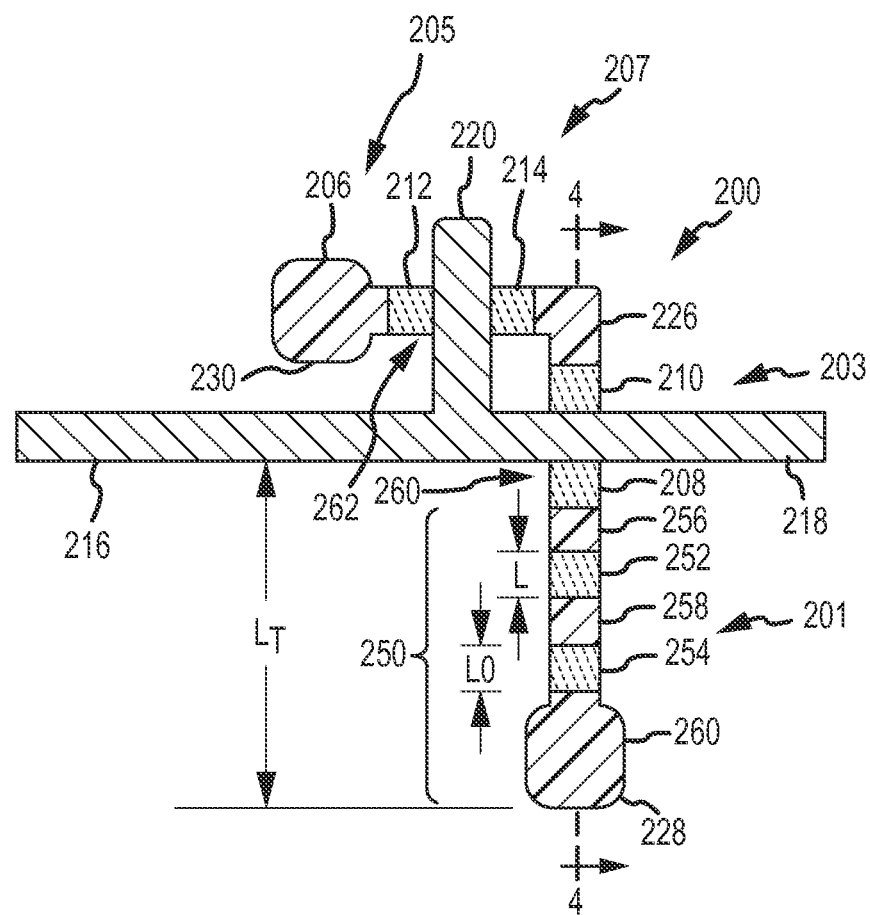
FIG. 3 is a top plan view of a TFT including an extension portion with additional doped regions, with an insulating layer remove for clarity.
Figure 4:
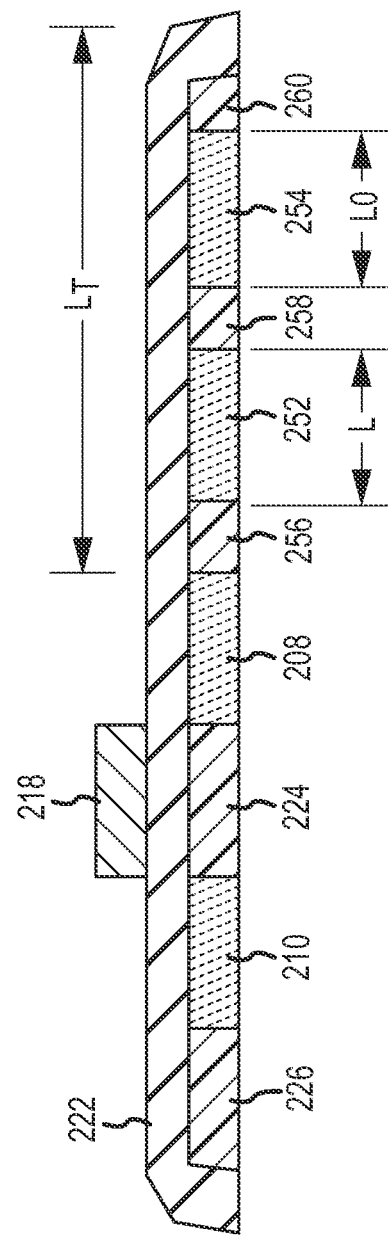
FIG. 4 is a cross-section view of the TFT of FIG. 3 taken along line 4-4 in FIG. 3, and including an insulating layer.

Embodiments of the present disclosure may reduce or substantially eliminate current leakage, and thus may reduce display artifacts such as flicker and crosstalk when TFTs of the present disclosure are incorporated into a display such as a LCD display. FIG. 3 is a simplified top plan view of a first embodiment of a thin film transistor 200 including an extended silicon layer 106 having two or more additional doped portions or slots. FIG. 4 is a cross-sectional view of the TFT 200 viewed along line 4-4 in FIG. 3. In some embodiments, the TFT 200 may be a low temperature poly-silicon (LTPS) transistor and may include a poly-silicon base processed at low temperatures. However, it should be noted that the techniques and ideas disclosed herein may be used for other types of transistors. For example, other types of poly-silicon transistors, other silicon based transistors (e.g., amphorous or crystalline silicon), and so on may incorporate the teachings and embodiments disclosed herein.

The TFT 200 may be somewhat similar to the TFT 100 illustrated in FIG. 1, in that the TFT 200 may include a metal layer 216 and a silicon layer 206 each having two branches or legs to form a multi-junction transistor. However, as shown in FIG. 3, the TFT 200 may further include an elongated or extension portion of the silicon layer 250. In some embodiments, the extension and the silicon layer may be a poly-silicon material and may include one more lightly doped regions, such as a LDD slots, discussed in more detail below, as well as one or more heavily doped regions that have an increased amount of dopant compared to the LDD regions. The extension 250 will be discussed in more detail below, but generally may act to decrease current leakage between two doped portions forming a source and a drain for the TFT 200.

The TFT 200 may include a metal or other conductive layer 206. The metal layer 206 may be a metal or metal alloy, such as, but not limited to, aluminum, gold, copper, or alloys thereof. Depending on the desired structure for the TFT 200, the metal layer 206 may have one or more branches 218, 220 to form two or more terminals, gates, or junctions. For example, the TFT 200 illustrated in FIG. 3 may have two gates as each branch 218, 220 may form an electrode for a source and drain pair of the semiconductor layer (doped portions of the silicon layer). However, it should be noted that in other embodiments, the number of terminals may be varied based on the desired design and/or application for the TFT 200. For example, the TFT 200 may include a single gate or more than two gates. As will be discussed in more detail below, the metal layer 216 may be communicatively coupled to one or more signal lines (e.g., data or gate lines)(not shown) which may provide signals to control the TFT 200. As shown in FIG. 3, the TFT 200 may include two gates or junctions 260, 262, where each gate 260, 262 may be defined as a source/drain pair and an electrode.

The TFT 200 may also include a silicon layer 206 that may have one more lightly doped portions 208, 210, 212, 214, where the lightly doped portions may form a portion of a source/drain pair along with one or more highly doped regions of the silicon layer. For example, a drain 203 for gate 201 is the combination of the lightly doped region 210 and the highly doped region 226 forming the intra-gate silicon layer between the two gates 260, 262. A source 201 for the gate 260 is the combination of lightly doped regions 208, 252, 254 and heavily doped regions 256, 258, 260 forming the extension. Similarly, the source 205 for gate 262 is the combination of the lightly doped region 212 and the heavily doped region 230, and the gate 207 for the gate 262 is the combination of the lightly doped region 214 adjacent the channel and the heavily doped region 226. Additionally, the silicon layer 206 may include the extension 250 which may include additional lightly doped regions or portions 252, 254. The silicon layer 206 may include two legs 228, 230, with the first leg 228 including the extension portion 250. The silicon layer 206 may include an elbow 226 or corner portion forming a transition between the two legs 228, 230. In some embodiments, the elbow 226 may also include a lightly doped portion (see FIG. 6) to form an intra-gate doped region, discussed in more detail below.

The silicon layer 206, including the extension 250, may include portions that have been doped with one or more dopants or doping agents (such as but not limited to, phosphor, arsenic, or the like). It should be noted that the silicon region 206 may include one or more areas that may be heavily doped with a dopant. For example, the elbow 226 and/or both legs 228, 230 may be doped an increased density of impurity atoms as compared to the lightly doped regions. It should be noted that in many instances, TFTs used for pixels in displays may be N-type, and so may be doped with phosphor or arsenic or other similar donor type materials. The doping agents may be elements that are inserted into the silicon layer 206 to alter select characteristics, such as the electrical properties, of the silicon layer 206. In some instances, the doped portions may have free electrons that allow an electric current to flow through the doped portion of the silicon layer 206. In such instances, the TFT 200 may form an N-type transistor.

Additionally, the doped portions of the silicon layer 206 may form a LDD or other similarly lightly or low doped structure. That is, the lightly doped portions of the silicon layer 206 may have a relatively low concentration of a doping agent. In some embodiments, the implant density of the doping agent for the doped portions may range between $10^{18}$-$10^{20}$ of impurity atoms per cubic centimeter. The LDD regions may have a lower dopant density as compared to other portions of the silicon layer 106, except for the channel forming the gates, which may not be doped with any doping agents.

The first two lightly doped portions along with the heavily doped regions of the first leg 228 may form a source 201 and a drain 203. Although, it should be noted that the source 201 and drain 203 may be alternatively arranged. That is, the first lightly doped regions 208, 252, 254 and the heavily doped regions 256, 258 260 of the extension 250 may form the drain, and the second lightly doped region 210 and the corner portion 226 of the layer 206 may form the source, depending on the desired structure for the TFT 200. The first leg 228 of the silicon layer 206 may thus include a first source/drain pair 201, 203 that extend across either side of the first branch 218 of the metal layer 216. As shown in FIG. 4, the source 201 and the drain 203 may be spaced from each other to from a channel 224. In some instances, two lightly doped regions 208, 210 may be formed adjacent to the channel 224. The channel 224, similar to the channel 124, may conduct current when a voltage is applied to the branch 218 as electrons move from the source 208 to the drain 210. For example, the metal branch 218 may be positioned parallel to and above the channel 224. The channel 224 may be formed of a portion of non-doped silicon of the silicon layer 206.

Unlike conventional transistors, the TFT 200 may include the extension portion 250 which may include additional lightly doped portions 252, 254. The additional lightly doped portions 252, 254, along with the first lightly doped region 208, may reduce electrical field interference that may affect the current transfer through the channel 224. For example, generally when the TFT 200 is activated, a lateral electric field may be induced due a non-zero potential between the source 201 and drain 203 as a voltage is applied to the metal layer 216. The lateral electric field causes electrons to move between the source 201 and drain 203, activating the TFT 200. However, in some instances the lateral electric field may cause current to leak (e.g., some conductivity across the channel 224) at zero and negative gate bias. That is, the lateral electric field may be strong enough to cause the TFT 200 to be slightly activated although little or no voltage may be applied to the metal layer 216. In some instances, the current leakage may be exponentially dependent on the lateral electric field, and thus reducing the lateral electric field may substantially reduce current leakage.

With reference again to FIGS. 3 and 4, the lateral electric field of the TFT 200 may be divided by the two additional lightly doped regions 252, 254 prior to reaching the junction 260. The additional lightly doped regions 208, 252, 254, which may be slots of LDD, may create multiple junctions to divide the lateral electric field along each of the junctions, and thus reduce the electric field as it travels from a first end of the extension 250 towards the junction 260. This is because the mobility of electrons (or other carriers) within the TFT 200 is related to the lateral electric field, and by increasing the lightly doped portions (LDD) within the silicon layer 206, the lightly doped regions 252, 254 decrease the mobility of carriers within the silicon layer 206, especially as many portions of the silicon layer may be heavily doped. Specifically, a depletion region may be formed at junctions between the lightly doped regions 208, 252, 254 and the heavily doped regions of the silicon layer 206 (which may be heavily doped N-Type poly-silicon). In the depletion region, the resistance may be very high as there may be no free carriers or electrons within that region. Accordingly, in some instances, the only way for the electrons to travel across the depletion region is to increase the electrical field in that area and sweep the electrons from an first edge of the junction to a second edge. In other words, most of the applied voltage will drop at the depletion region between the lightly doped regions and the heavily doped regions of the silicon layer 206 Therefore, by increasing the doped regions of LDD, the division of the lateral field is increased, and the electrical field at top or upper lightly doped region 208 near the channel 124 is reduced in that fewer carriers (electrons) may be able to move out from the channel 224 to form a leakage current.

In some embodiments, the extension 250 may include a single lightly doped region that extends the entire length LT of the extension. In these embodiments, the electric field may be reduced; however, the resistance of the TFT 200 may be substantially increased, reducing the conductivity. This is because the LDD regions may have an increased resistance as compared to the more heavily doped regions of the layer 206.

Accordingly, in many embodiments, the extension 250 may include the lightly doped regions 252, 254 spaced apart from one another by one or more heavily doped or spacing regions 256, 258 formed of the silicon layer 206. In these embodiments, the TFT 200 may maintain a required level of conductivity and act to reduce the lateral electric field and thus current leakage.

In some embodiments, the first lightly doped region 252 may have a length L and the second lightly doped region 254 may have a length L0. The lengths L and L0 may range from 1 to 4 microns, depending on the desired application for the TFT 200. For example, if the TFT 200 is used in a display screen, the total length LT of the extension 250, and thus the lightly doped regions L and L0, may depend on the desired resolution of the screen. The better the resolution, the shorter the extension length LT. However, even with relatively high resolutions, the extension 250 may still be a sufficient length to provide a sufficient reduction in the lateral electric field to reduce current leakage. In some embodiments, this length may range between 3 μm to 30 μm. Additionally, as will be discussed in more detail below, the lengths the various lightly doped regions may vary as compared to each other.

It should be noted that the lightly doped regions, which may be LDD slots, may be formed in the same mask as the n-type doping. Accordingly, the manufacturing process for the TFT 200 may be similar to conventional manufacturing processes, except that the length of the silicon layer may be extended to include the extension, and additional portions of LDD or other doping regions may be applied.

With reference again to FIG. 3, the second leg 230 of the silicon layer 206 may be substantially similar to the second leg 130 of the TFT 100. For example, the second leg 230 may include a source 205 (defined as the heavily doped end 230 and the lightly doped region 212 adjacent the metal branch) and a drain 207 (defined as the heavily doped region 226 and the lightly doped region 214) that may be separated by a channel (not shown). The metal branch 218 may induce electrons to travel between the source 205 and drain 207 across the channel to create current flow. However, because the silicon layer 206 is formed with the extension member 250, the reduction in the lateral electric field may also reduce current leakage across this gate 262 as well as the first gate junction 260.

Figure 5:
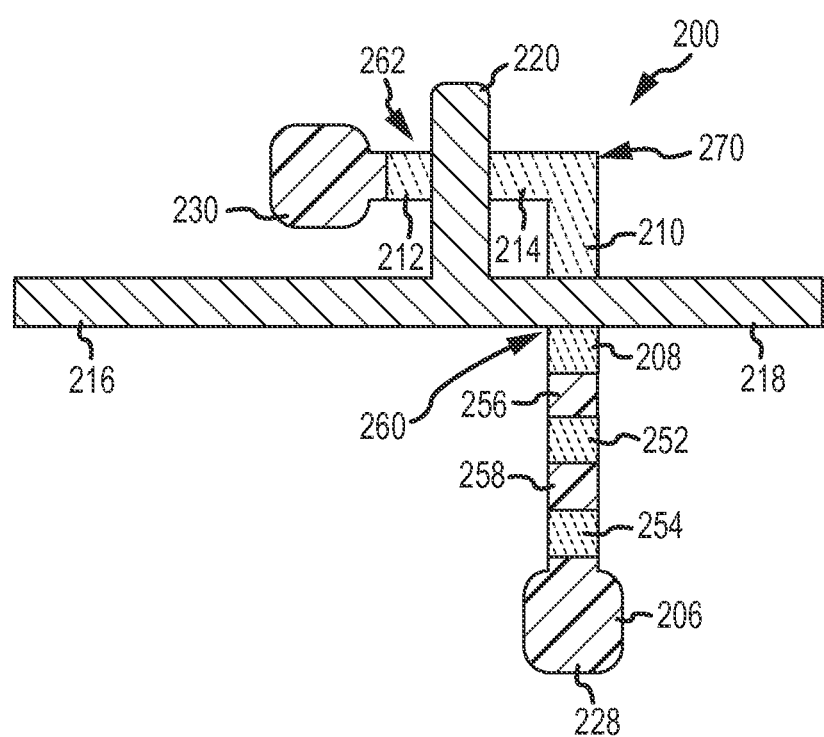
FIG. 5 is a top plan view of a second example of a TFT including the extension portion and having an intra-gate doped region.

In some embodiments, the TFT 200 may include a lightly doped region that extends between the two gates 260, 262. FIG. 5 is a simplified top view of an example of the TFT with a doped region extending between the first gate and the second gate. In this embodiment, a lightly doped region 270 may extend between the first electrode or branch 218 and the second electrode or branch 220 to form an intra-gate doped region. In this embodiment, the two drains 210, 214 may be formed of a single lightly doped region, the lightly doped region 270. This may provide an additional junction for the TFT 200 to further reduce the lateral electric field.

It should be noted that, in embodiments where the lightly doped region 270 extends between the two gates 260, 262, the TFT 200 may have an increased resistance through the silicon layer 206 and doping regions. Accordingly, in instances where a higher conductivity may be desired, embodiments such as the TFT illustrated in FIGS. 3 and 4 may be preferred, as the series resistance of the two doped regions 208, 210, rather than the single resistive region of the lightly doped region 270, may have a better conductivity.

Figure 6:
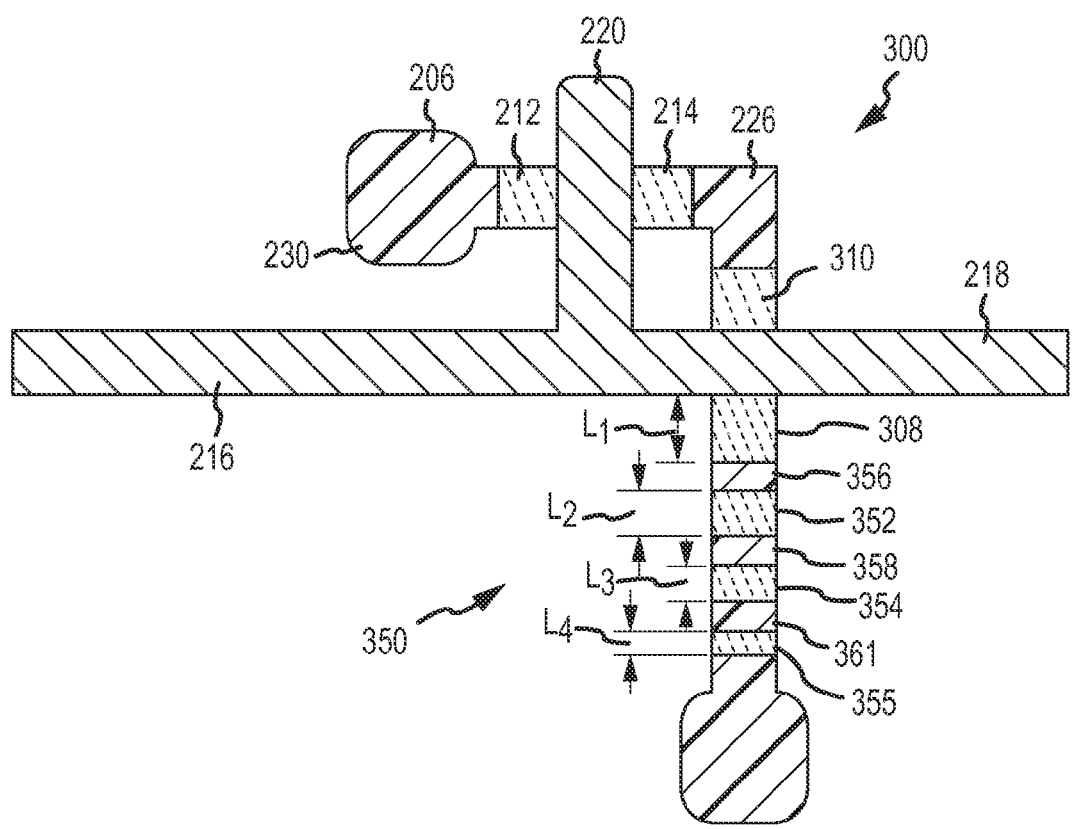
FIG. 6 is a top plan view of a third example of a TFT including the extension portion with the doped regions having a variable length.

In some instances, the number of the additional lightly doped regions may be increased and/or the length of the various lightly doped regions may be varied from one another. FIG. 6 is a top simplified view of another example of a TFT 300. In this example, an extension region 350 may include four lightly doped regions. A first lightly doped region 308 may form a portion of a source drain pair 308, 310 communicatively coupled to the first metal branch 218. The first lightly doped region 308 may have a length of L1. A second lightly doped region 352 may be spaced from the first lightly doped region 308 by a spacer 356 of heavily doped silicon, the second lightly doped region 352 may have a length of L2. A third lightly doped region 354 may be spaced from the second lightly doped region 352 by a spacer 358 and may have a length of L3. A fourth lightly doped region 355 may be spaced from the third doped region 354 by a spacer 361 and may have a length L4. Each of the spacers may be heavily doped regions of silicon, which may have an increased density of dopant agents compared to the lightly doped regions.

With reference to FIG. 6, in some embodiments, each of the lengths L1, L2, L3, and L4 may be different from one another. As a first example, L1 may be greater than L2, L2 may be greater than L3, and L3 may be greater than L4. In this manner, the length of the lightly doped regions on the silicon layer 206 may increase in length closer towards the channel 224. As a non-limiting example, the first length L1 may be approximately 4 microns, the second length L2 may be approximately 3 microns, the third length L3 may be approximately 2 microns and the fourth length L4 may be 1 micron. However, it should be noted that the lengths L1, L2, L3, and L4 may be selected based on the desired applications and characteristics of the TFT 300, and the above listed examples are meant as illustrative only.

In some embodiments, one or more of the lengths L1, L2, L3, and L4 may be the same as one another. In other embodiments, the lengths L2, L3, and/or L4 may be varied from one another, but may not gradually increase in length. In some instances, the first lightly doped region 308 may provide the greatest reduction in the lateral electric field as compared to the other doped regions 352, 354, 355. This is because the first lightly doped region 308 is adjacent to the channel 224 and may better reduce the electric field at the edge of the channel 224. In these instances, the remaining lightly doped regions 352, 354, 355 may function to divide the lateral electric field, which then may allow the first region 308 to more easily reduce the electric field. Accordingly, the lengths L2, L3, and L4 of the second through fourth lightly doped regions may be relatively small as compared to the first lightly doped region 308, which may still reduce the overall electric field in the TFT 300. The division of the electric field may be a relatively linear division, accordingly in some instances three lightly doped regions on the extension 250 may be sufficient to substantially reduce the electric field; however, additional lightly doped regions may also further reduce the electric field.

The spacers 356, 358, 361 are heavily doped portions of the poly-silicon or other silicon layer and may separate the lightly doped regions. The length of the spacers 356, 358, 361 may be modified to match the lengths of the lightly doped regions, may be different from the lightly doped regions, and/or may be constant or varied across the length of the extension 350. For example, as shown in FIG. 6, the spacers may have relatively the same length, whereas the length of the lightly doped regions may vary. However other variations are also envisioned.

Figure 7:
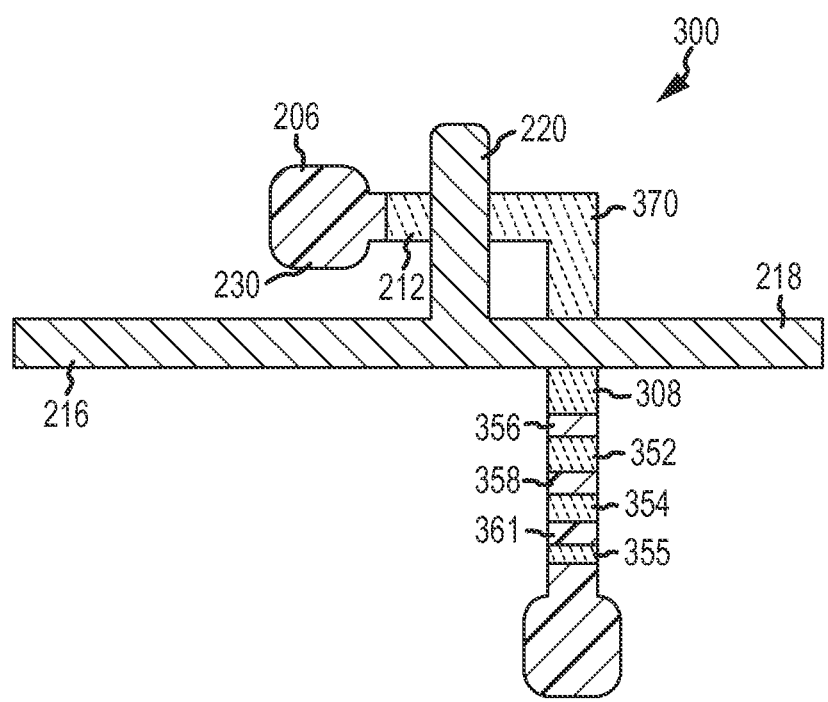
FIG. 7 is a top plan view of the TFT of FIG. 6 but including an intra-gate doped region.

The TFT 300 of FIG. 6 may further include a lightly doped region 370 that may extend between the two gates 360, 362. FIG. 7 is a top plan view of the TFT 300 of FIG. 6, with a lightly doped region 370 extending between the first gate 360 and the second gate 362. As with FIG. 5, in this embodiment, the TFT 300 may include an additional junction, which may further reduce the electric field but may increase the resistance of the TFT.

Single Gate TFT

Figure 8:
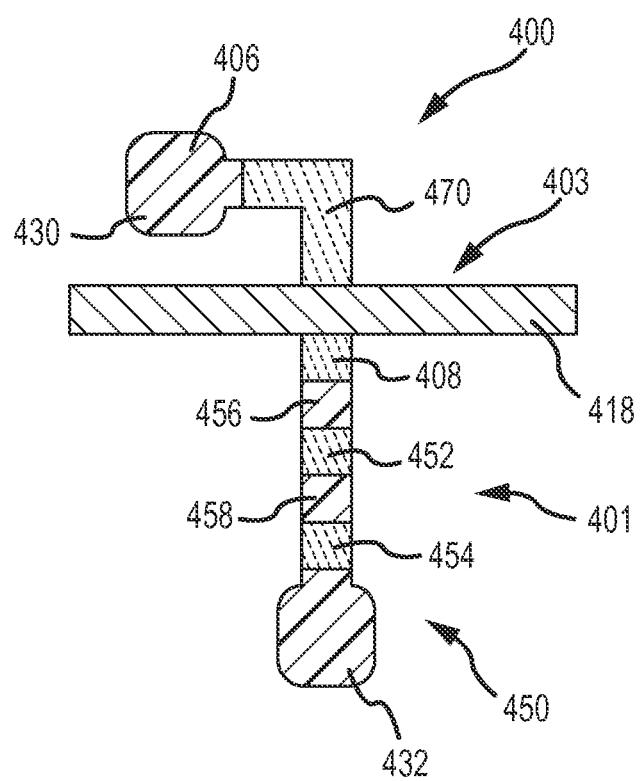
FIG. 8 is a top plan view of a single gate TFT including additional doped regions on both sides of a channel, with one side of the channel having an extended doped region.

In some embodiments, the TFT may have only a single gate, e.g., only one metal or conductive branch. FIG. 8 is a top plan view of a single gate TFT including additionally doped regions. The TFT 400 may include a metal branch 418 that may divide a silicon layer 406 into a source portion 401 and a drain portion 403. It should be noted that although the different portions 401, 403 are discussed herein as being either the source or drain, the actual source and drain may be positioned on either side of the branch or otherwise oriented. Further, the different examples discussed below may be implemented on either the source or drain side of the TFT. Accordingly, the discussion of a particular structure being on the drain or source side of the branch is illustrative only and not meant to be limiting.

With reference to FIG. 8, the source portion 401 may include an extension 450 which may include additionally lightly doped regions 452, 454 that may be separated by one or more spacers 456, 458 (which may be heavily doped regions). The first or upper lightly doped region 408 may form partial portion of the source 401 for the TFT 400, and one or more electrons may travel across the channel (not shown) to the drain 403. The additionally lightly doped regions 452, 454 and may be formed as LDD structures, and the spacers 456, 458 may be heavily doped regions of the silicon layer 406. The second lightly doped region 454 may be located adjacent to an end 432 of the silicon layer 406. As will be discussed below, the lightly doped region 408 adjacent the channel 408 and/or the additional lightly doped regions 452, 454 may have the same lengths or varying lengths from each other. However, as shown in FIG. 8, in this embodiment, each of the lightly doped regions 408, 452, 454 may have approximately the same length as each other.

With continued reference to FIG. 8, the drain portion 403, may include a lightly doped region 470 and heavily doped region 430 forming the drain. The lightly doped region 470 in this example may form a "L" shape as it transitions from a location adjacent to the channel (not shown) to the end 430 of the silicon layer 406. The lightly doped region 470, however, may terminate prior to the end 430 of the layer 406. In other words, the doped region 470 may form a substantially continuously lightly doped region along the drain side of the silicon layer 406.

Figure 9:
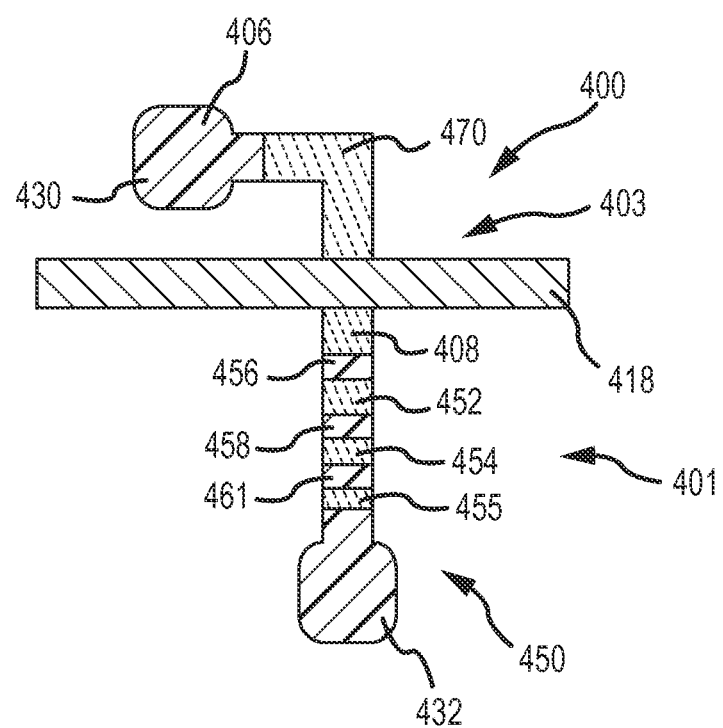
FIG. 9 is a top plan view of the single gate TFT of FIG. 8 having additional doped regions of varying lengths, with one side of the channel having an extended doped region.

In another example, the TFT 400 may include additional lightly doped layers that gradually increase in length from the end 430 towards the branch 418. FIG. 9 is a top plan view of a single gate TFT having additionally lightly doped regions with varying lengths. With reference to FIG. 9, the TFT 400 may include the first lightly doped region 408, a second lightly doped region 452, a third lightly doped region 454, and a fourth lightly doped region 455. Each of the lightly doped regions 408, 452, 455, 455 may have a length that may be different than the adjacent lightly doped region. In one instance, the length of the lightly doped regions may increase from the end 432 towards the branch 418, such that the first lightly doped region 408 may have the longest length, the second lightly doped region 452 may have the next longest length, the third lightly doped region 454 may have the third largest length, and the fourth lightly doped region 455 may have the shortest length. However, the lengths of the lightly doped regions may be otherwise varied, e.g., they may decrease in length from the end 432 towards the branch 410, or may have random lengths along a length of the extension 450.

With continued reference to FIG. 9, similar to FIG. 8, in the TFT 400 the drain side of the silicon layer 406 may include the lightly doped region 470 that may extend along a substantial length of the drain portion 403.

Figure 10:
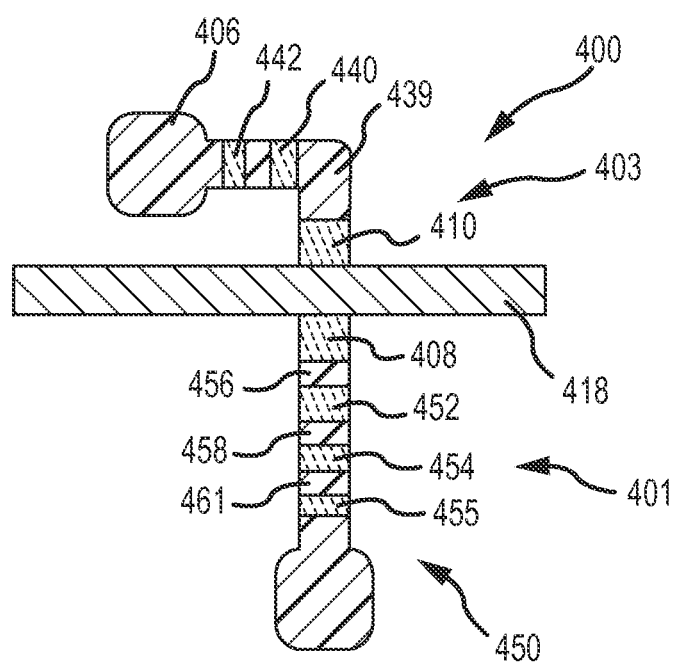
FIG. 10 is a top plan view of a single gate TFT including multiple additional doped regions with variable lengths on both sides of the channel.

In yet other embodiments, the drain side 403 of the TFT 400 may include varying portions of lightly doped regions. FIG. 10 is a top plan view of a single gate TFT including multiple lightly doped regions on either side of the branch. In this example, the extension 450 portion of the TFT 400 may be substantially similar to the extension portion 450 of the TFT illustrated in FIG. 9. In other words, the TFT 400 may include multiple lightly doped regions on the source side of the silicon layer 406 that vary in length from the end 432 towards the branch 418. However, in this example, the TFT 400 may further include a drain lightly doped region 410 as well as a first additional lightly doped region 440 and a second lightly doped region 442. The two lightly doped regions 440, 442 may have the same length or varying lengths (see FIG. 11). In these embodiments, the additional doped regions 440, 442 may also be LDD structures and may help to reduce the lateral field, while not significantly reducing the conductivity of the silicon layer 406. For example, the drain region 403 illustrated in FIG. 8 includes a single lightly doped region that has a long length, and may therefore have an increased resistance as compared to the TFT 400 of FIG. 10 where the lightly doped regions are separated by heavily doped regions of the silicon 406.

In some embodiments, the 410 may have a first length, the first additional lightly doped region 440 may have a second length, and the third lightly doped region 442 may have a third length, where the first length, the second length, and the third length may be different from each other. As one example, the lengths of the lightly doped regions 410, 440, 442 may decrease the farther they are from the branch 418. As discussed above, this is because in many instances the lightly doped region closest to the channel may have the largest effect on the reduction of the electric field, and so keeping the other regions smaller may reduce the resistance of the silicon layer 406, while still dividing the electric field.

With continued reference to FIG. 10, the drain 410 may be separated from the first additional lightly doped region 440 by a spacer 439. Depending on the desired shape of the TFT 400, the spacer 439 as shown in FIG. 10 may form a corner or elbow so that the drain portion 403 of the TFT 400 may have a "L" shape as it transitions away from the branch 418 towards the end portion. In this example, both sides of the channel (not shown) may have regions that may act to reduce the lateral electric field of the silicon layer 406, without substantially increasing the resistance of the TFT, as the spacer may be formed of a heavily doped silicon material.

Figure 11:
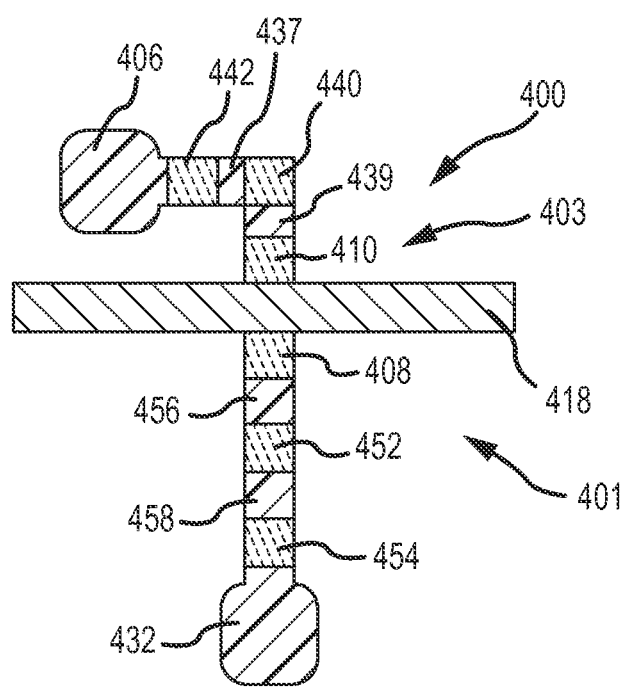
FIG. 11 is a top plan view of a single gate TFT including multiple additional doped regions with the same length on both sides of the channel.

In yet other examples, the TFT may include additional lightly doped regions on either side of the channel, where each lightly doped region has approximately the same length. FIG. 11 is a top plan view of a single gate TFT including lightly doped regions having approximately the same length. In this example, the source portion 401 may include the three lightly doped regions 408, 452, 454 that may each have approximately the same length and be separated by a first spacer 456 and a second spacer 458, each having approximately the same length. The drain portion 403 may include three lightly doped regions 410, 440, 442 each having approximately the same length, and being separated by a first spacer 439 and a second spacer 437. In these instances, the second doped region 440 on the drain portion 403 may form the elbow for the silicon layer 406, whereas the spacer 439 or heavily portion between the drain 410 and the other doped region 440 may have a reduced length. However, in other embodiments, the lengths of the spacer and/or doped regions may be differently configured.

Figure 12:
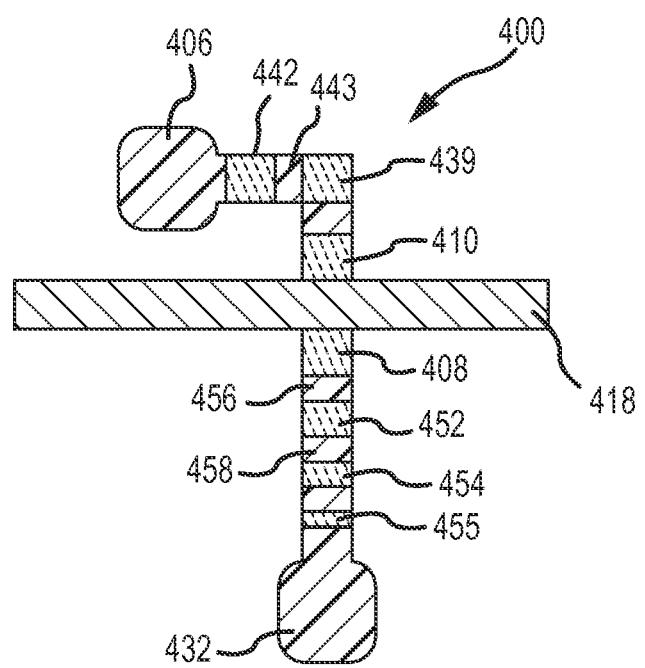
FIG. 12 is a top plan view of a single gate TFT including multiple additional doped regions, where one side of the channel the additional doped regions have the same length and one side of the channel the additional doped regions have varying lengths.

In some embodiments, a first side of the metal branch 418 may have lightly doped regions with different lengths and a second side of the branch 418 may have lightly doped regions with the same length. FIG. 12 is a top plan view of a single gate TFT including a first side 401 having lightly doped regions with varying lengths and a second side 403 having lightly doped regions with the same length. In this example, the first side 401, which may be the source side or the drain side, may include an additional lightly doped region compared to the second side 403. However, in other embodiments, the second side 403 may include more lightly doped regions than the first side.

It should be noted that the above examples for the single gate TFTs may be combined with each other or otherwise varied. Additionally, although the examples may be discussed with respect to a "source" side and a "drain" side, the two sides and/or structures may be reversed depending on the implementation of the TFT. Moreover, although the above examples are discussed with respect to single gate TFTs, depending on the space available in a particular structure or device incorporating the TFT, the examples may also be incorporated into double gate TFTs.

CONCLUSION

The foregoing description has broad application. For example, while examples disclosed herein may focus on thin film transistors, it should be appreciated that the concepts disclosed herein may equally apply to substantially any other type of transistor or semiconductor device. Similarly, although the input device and TFTs may be discussed with respect to display screens and devices, the devices and techniques disclosed herein are equally applicable to other types of applications including transistors, such as TFTs. Accordingly, the discussion of any embodiment is meant only to be exemplary and is not intended to suggest that the scope of the disclosure, including the claims, is limited to these examples.

What is claimed is:

1. A computing device, comprising:
an electronic display comprising:
a first pixel; and
a first transistor coupled to the first pixel and configured to selectively activate the first pixel, the transistor comprising:
a metal layer;
a silicon layer deposited on at least a portion of the metal layer, the silicon layer including an extension portion that extends a distance past the metal layer; and
at least three lightly doped regions positioned in the silicon layer; and
a processor in communication with the first pixel and the first transistor, wherein the processor selectively activates the first transistor to activate the first pixel;
wherein the first transistor is a multi-function transistor.

2. The computing device of claim 1, wherein the at least three lightly doped regions are separated by the silicon layer, wherein the silicon layer has a higher concentration of dopant than the at least three lightly doped regions.

3. The computing device of claim 1, wherein the at least three lightly doped regions have substantially the same length.

4. The computing device of claim 1, wherein the first transistor comprises a first gate and a second gate.

5. The computing device of claim 1, wherein the at least three lightly doped regions comprise a first lightly doped region, a second lightly doped region, and a third lightly doped region.

6. The computing device of claim 5, wherein
the first lightly doped region has a first length;
the second lightly doped region has a second length; and
the third lightly doped region has a third length; wherein the first length, the second length, and the third length at different from each other.

7. The computing device of claim 6, wherein the first length is longer than the second length and the second length is longer than the third length.

8. A computing device, comprising:
an electronic display comprising:
a first pixel; and
a first transistor coupled to the first pixel and configured to selectively activate the first pixel, the transistor comprising:
a metal layer;
a silicon layer deposited on at least a portion of the metal layer, the silicon layer including an extension portion that extends a distance past the metal layer; and
at least three lightly doped regions positioned in the silicon layer; and
a processor in communication with the first pixel and the first transistor, wherein the processor selectively activates the first transistor to activate the first pixel;
wherein the at least three lightly doped regions comprise a first lightly doped region, a second lightly doped region, and a third lightly doped region;
wherein the first lightly doped region has a first length, the second lightly doped region has a second length, and the third lightly doped region has a third length;
wherein the first length, the second length, and the third length are different from each other;
wherein the first length is longer than the second length and the second length is longer than the third length;
wherein the first lightly doped region, the second lightly doped region, and the third lightly doped region reduce the mobility of current carriers within the silicon layer.

9. A computing device, comprising:
an electronic display comprising:
a first pixel; and
a first transistor coupled to the first pixel and configured to selectively activate the first pixel, the transistor comprising:
a metal layer;
a silicon layer deposited on at least a portion of the metal layer, the silicon layer including an extension portion that extends a distance past the metal layer; and
at least three lightly doped regions positioned in the silicon layer; and
a processor in communication with the first pixel and the first transistor, wherein the processor selectively activates the first transistor to activate the first pixel;
wherein the at least three lightly doped regions are formed on a source portion of the first transistor.

* * * * *